US007206199B1

(12) United States Patent  (10) Patent No.: US 7,206,199 B1
Jimenez et al.                (45) Date of Patent:     Apr. 17, 2007

(54) METHOD AND APPARATUS FOR COUPLING A COMPONENT IN A CHASSIS

(75) Inventors: Salvador Jimenez, Cedar Park, TX (US); Shannon Bynum, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 22 days.

(21) Appl. No.: 11/237,073

(22) Filed: Sep. 27, 2005

(51) Int. Cl.
  *G06F 1/16* (2006.01)
  *H05K 5/00* (2006.01)
(52) U.S. Cl. .................. 361/684; 312/223.2; 710/303; 361/816
(58) Field of Classification Search .................. 439/61, 439/752; 312/223.2, 311, 263; 710/303, 710/304; 174/372; 361/679–687, 724–727, 361/816, 730
See application file for complete search history.

(56) References Cited

U.S. PATENT DOCUMENTS 5,332,306 A    7/1994  Babb et al.
6,819,567 B2 * 11/2004 Baker et al. ................. 361/724
6,876,547 B2    4/2005  McAlister
2005/0157464 A1  7/2005  McAlister
2006/0023413 A1* 2/2006  Lo et al. ...................... 361/684
2006/0232930 A1* 10/2006 Artman et al. .............. 361/695
2006/0238988 A1* 10/2006 Wobig et al. ............... 361/756

OTHER PUBLICATIONS

Marcade, Michael D. et al., "Hard Drive Carrier", U.S. Appl. No. 10/940,072, filed Sep. 14, 2004.

* cited by examiner

*Primary Examiner*—Hung Van Duong
(74) *Attorney, Agent, or Firm*—Haynes and Boone, LLP (57) ABSTRACT

A component coupling apparatus includes a wall comprising a first surface, a second surface located opposite the first surface, and defining a guide coupling aperture extending through the wall from the first surface to the second surface. A first guide member is coupled to the wall through the guide coupling aperture and positioned adjacent the first surface. A second guide member is coupled to the wall through the guide coupling aperture and positioned adjacent the second surface. A component may be coupled to the wall using the guide member.

22 Claims, 13 Drawing Sheets

METHOD AND APPARATUS FOR COUPLING A COMPONENT IN A CHASSIS

BACKGROUND

The present disclosure relates generally to information handling systems, and more particularly to a method and apparatus for coupling a component to an information handling system chassis.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems include components such as, for example, fans, which are coupled to the information handling system chassis. As the information handling system chassis is made smaller and/or more components are added to the information handling system chassis, the space in the information handling system chassis becomes limited, which raises an issue with regards to the coupling of these components to the information handling system.

Typical solutions for coupling components to a chassis include providing spaced apart guide rails mounted to the chassis. The component is then coupled to the chassis by positioning it between the guide rails. However, conventional guide rail solutions require a relatively large amount of space in the information handling system chassis, resulting in less space available for components.

Accordingly, it would be desirable to provide a method and apparatus for coupling a component to a chassis absent the disadvantages found in the prior methods discussed above.

SUMMARY

According to one embodiment, a component coupling apparatus is provided which includes a wall comprising a first surface, a second surface located opposite the first surface, and defining a guide coupling aperture extending through the wall from the first surface to the second surface, a first guide member coupled to the wall through the guide coupling aperture and positioned adjacent the first surface, and a second guide member coupled to the wall through the guide coupling aperture and positioned adjacent the second surface.

BRIEF DESCRIPTION OF THE DRAWINGS

FIG. 3b is a front perspective view illustrating an embodiment of the guide feature of FIG. 3a.

FIG. 4b is a rear perspective view illustrating an embodiment of the wall of FIG. 4a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
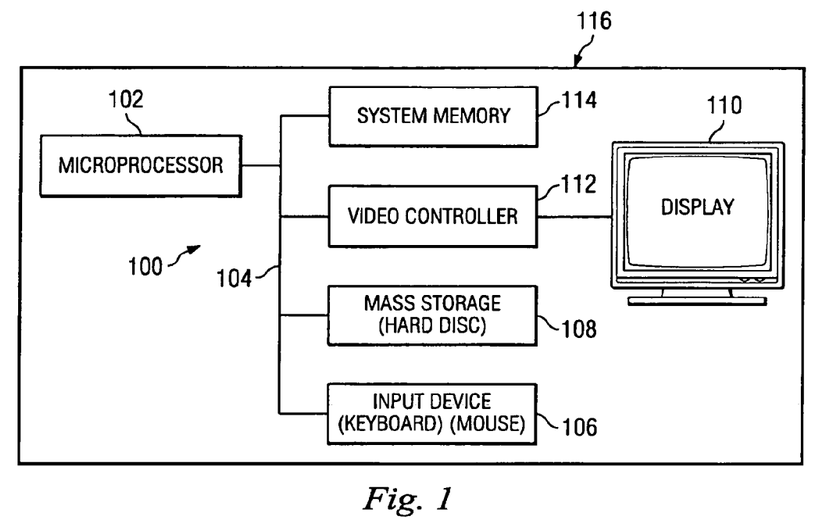
FIG. 1 is a schematic view illustrating an embodiment of an information handling system.

In one embodiment, information handling system 100, FIG. 1, includes a microprocessor 102, which is connected to a bus 104. Bus 104 serves as a connection between microprocessor 102 and other components of computer system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. Information handling system 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of information handling system 100. It should be understood that other buses and intermediate circuits can be deployed between the components described above and microprocessor 102 to facilitate interconnection between the components and the microprocessor.

Figure 2:
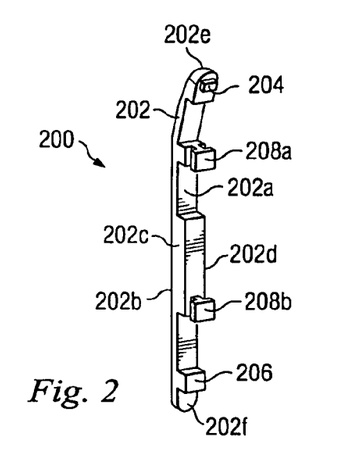
FIG. 2 is a perspective view illustrating an embodiment of a guide member.

Referring now to FIG. 2, a guide member 200 is illustrated. The guide member 200 includes an elongated base 202 having a front surface 202a, a rear surface 202b located opposite the front surface 202a, a plurality of opposing guide surfaces 202c and 202d extending between the front surface 202a and the rear surface 202b, a top end 202e, and a bottom end 202f located opposite the top end 202e. A securing tab 204 extends from the front surface 202a and is located adjacent the top end 202e. A support surface 206 extends from the front surface 202a and is located adjacent the bottom end 202f. A pair of coupling members 208a and 208b extends from the front surface 202a in a spaced apart relationship between the securing tab 204 and the support surface 206.

Figure 3A:
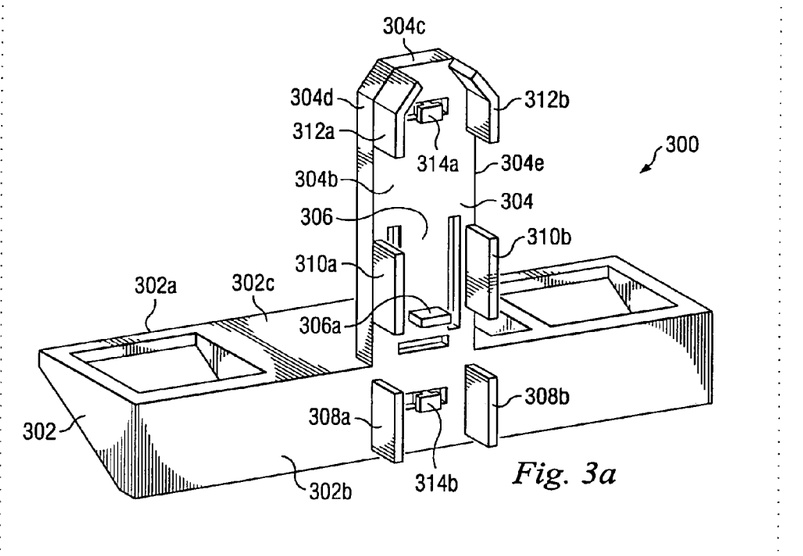
FIG. 3a is a rear perspective view illustrating an embodiment of a guide feature used with the guide member of FIG. 2.
Figure 3B:
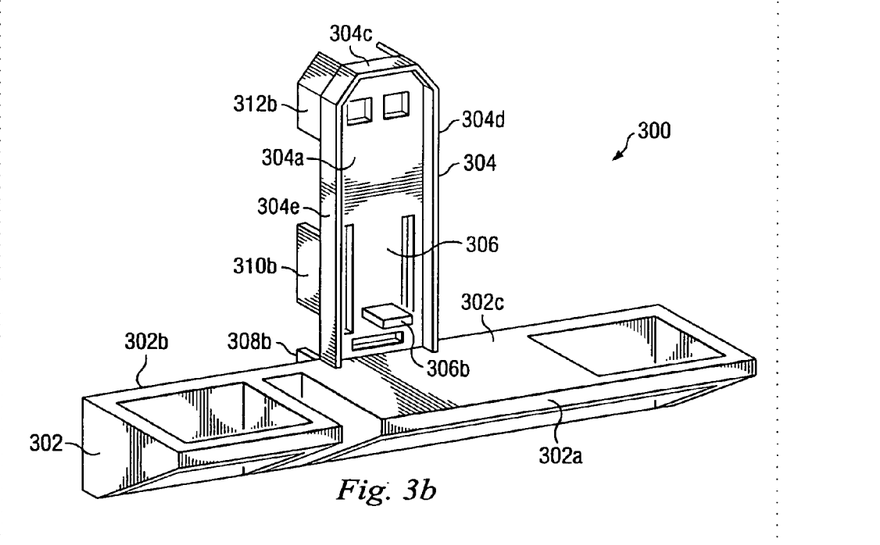

Referring now to FIGS. 3a and 3b, a guide feature 300 is illustrated. The guide feature 300 includes a base 302 having a front edge 302a, a rear surface 302b located opposite the front edge 302a, and a fan support surface 302c extending between the front edge 302a and the rear surface 302b. A mounting arm 304 is centrally located on the base 302 and extends from the fan support surface 302c adjacent the rear surface 302c. The mounting arm 304 includes a front surface 304a, a rear surface 304b located opposite the front surface 304a, a distal end 304c, and a pair of opposing guide surfaces 304d and 304e extending between the base 302 and the distal end 304c. A wall securing beam 306 is located on the mounting arm 304 and includes a securing tab 306a extending past the rear surface 304b of the mounting arm 304 and a beam handle 306b extending past the front surface 304a of the mounting arm 304. A pair of guide surfaces 308a and 308b extend from the rear surface 302b of the base 302 in a substantially parallel and spaced apart relationship. A pair of guide surfaces 310a and 310b extend from the rear surface 304b of the mounting arm 304 in a substantially parallel and spaced apart relationship on opposite sides of the wall securing beam 306. A pair of guide surfaces 312a and 312b extend from the rear surface 304b of the mounting arm 304 adjacent the distal end 304c in a substantially parallel and spaced apart relationship. A coupling member 314a extends from the rear surface 304b of the mounting arm 304 adjacent the distal end 304c and between the guide surfaces 312a and 312b. A coupling member 314b extends from the rear surface 302b of the base 302 and between the guide surfaces 308a and 308b.

Figure 4A:
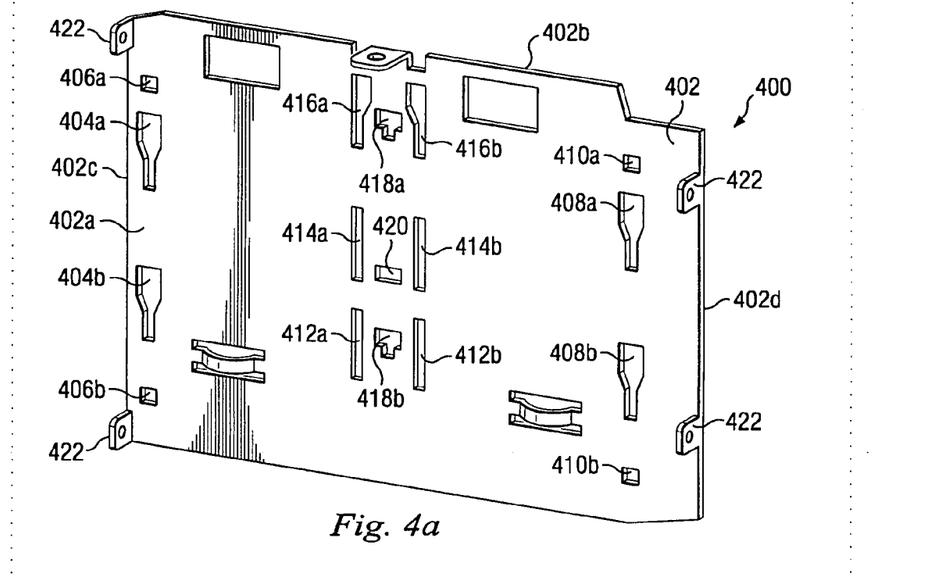
FIG. 4a is a front perspective view illustrating an embodiment of a wall used with the guide member of FIG. 2 and the guide feature of FIGS. 3a and 3b.
Figure 4B:
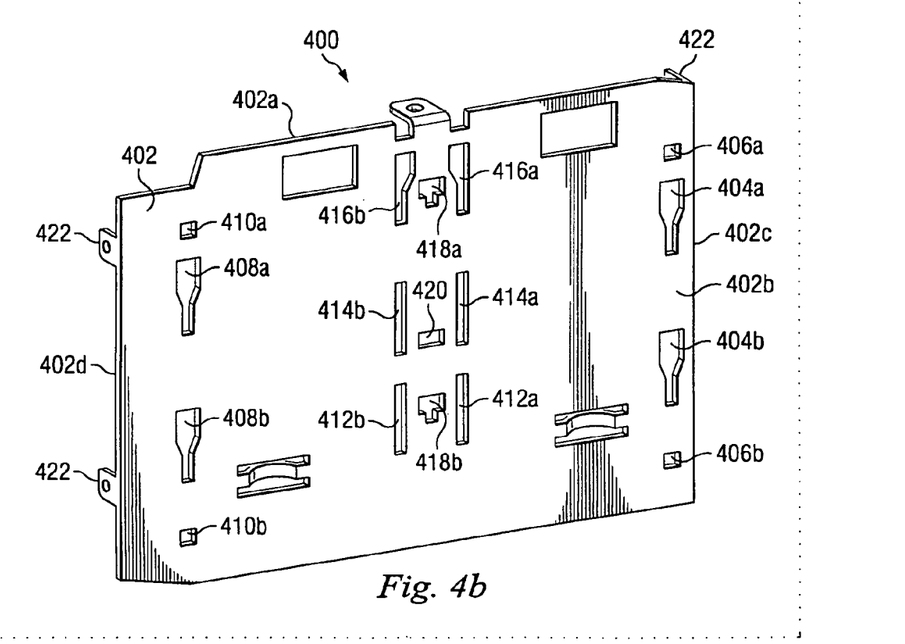

Referring now to FIGS. 4a and 4b, a wall 400 is illustrated. The wall 400 includes a base 402 having a front surface 402a, a rear surface 402b located opposite the front surface 402a, and a pair of opposing side edges 402c and 402d extending between the front surface 402a and the rear surface 402b. A pair of tapered guide coupling apertures 404a and 404b are defined by the wall 400 and extend through the wall 400 from the front surface 402a to the rear surface 402b. A securing aperture 406a is defined by the wall 400 and located adjacent the guide coupling aperture 404a. A securing aperture 406b is defined by the wall 400 and located adjacent the guide coupling aperture 404b. A pair of tapered guide coupling apertures 408a and 408b are defined by the wall 400 and extend through the wall 400 from the front surface 402a to the rear surface 402b. A securing aperture 410a is defined by the wall 400 and located adjacent the guide coupling aperture 408a. A securing aperture 410b is defined by the wall 400 and located adjacent the guide coupling aperture 408b. A pair of guide feature apertures 412a and 412b are defined by the wall 400 and centrally located on the wall 400 in a substantially parallel and spaced apart relationship. A pair of guide feature apertures 414a and 414b are defined by the wall 400 and centrally located on the wall 400 in a substantially parallel and spaced apart relationship adjacent the pair of guide feature apertures 412a and 412b. A pair of guide feature apertures 416a and 416b are defined by the wall 400 and centrally located on the wall 400 in a substantially parallel and spaced apart relationship adjacent the pair of guide feature apertures 414a and 414b. A tapered coupling aperture 418a is defined by the wall 400 and located between the guide feature apertures 416a and 416b. A tapered coupling aperture 418b is defined by the wall 400 and located between the guide feature apertures 412a and 412b. A securing aperture 420 is defined by the wall 400 and located between the guide feature apertures 414a and 414b. A plurality of chassis mounting tabs 422 extend from the side edges 402c and 402d of the wall 400. In an embodiment, the wall 400 is fabricated from a conventional sheet metal using methods known in the art.

Figure 5:
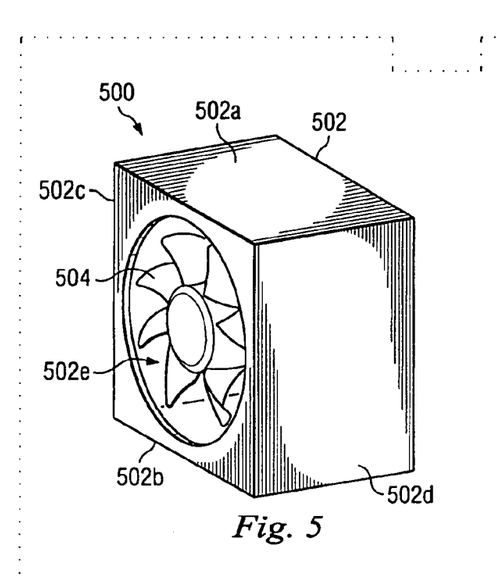
FIG. 5 is a perspective view illustrating an embodiment of a fan module used with the guide member of FIG. 2, the guide feature of FIGS. 3a and 3b, and the wall of FIGS. 4a and 4b.

Referring now to FIG. 5, a fan module 500 is illustrated. The fan module 500 includes a base 502 having a top surface 502a, a bottom surface 502b, a plurality of opposing side surfaces 502c and 502d extending between the top surface 502a and the bottom surface 502b, and defining a fan housing 502e. A fan 504 is positioned in the fan housing 502e. In an embodiment, the fan module 500 is a conventional fan module known in the art.

Figure 6A:
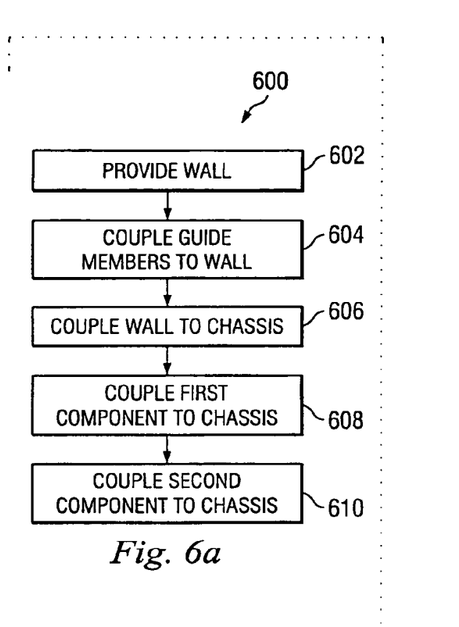
FIG. 6a is a flow chart illustrating an embodiment of a method for coupling a component to a chassis.
Figure 6B:
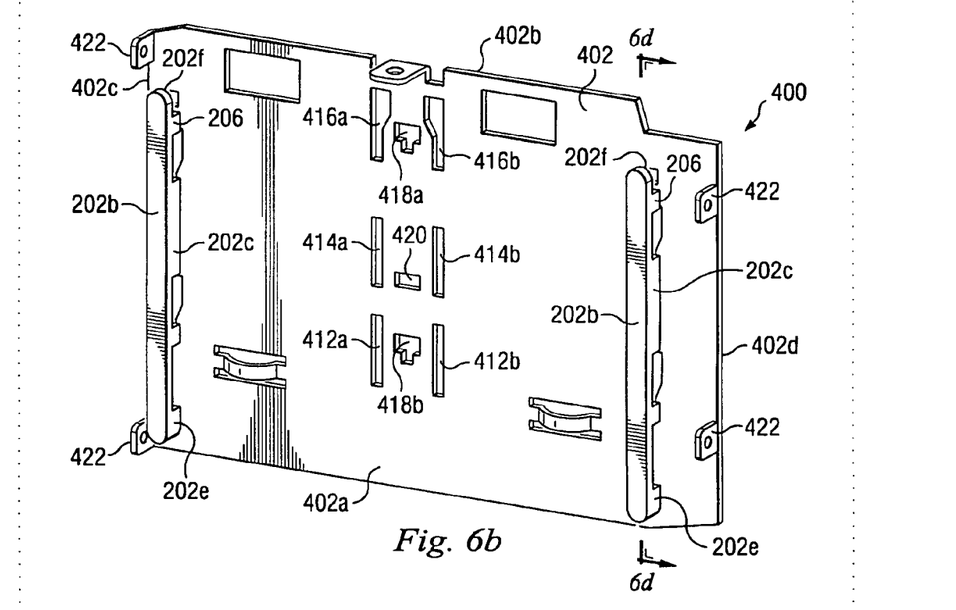
FIG. 6b is a front perspective view illustrating an embodiment of a plurality of the guide members of FIG. 2 coupled to the wall of FIGS. 4a and 4b.
Figure 6C:
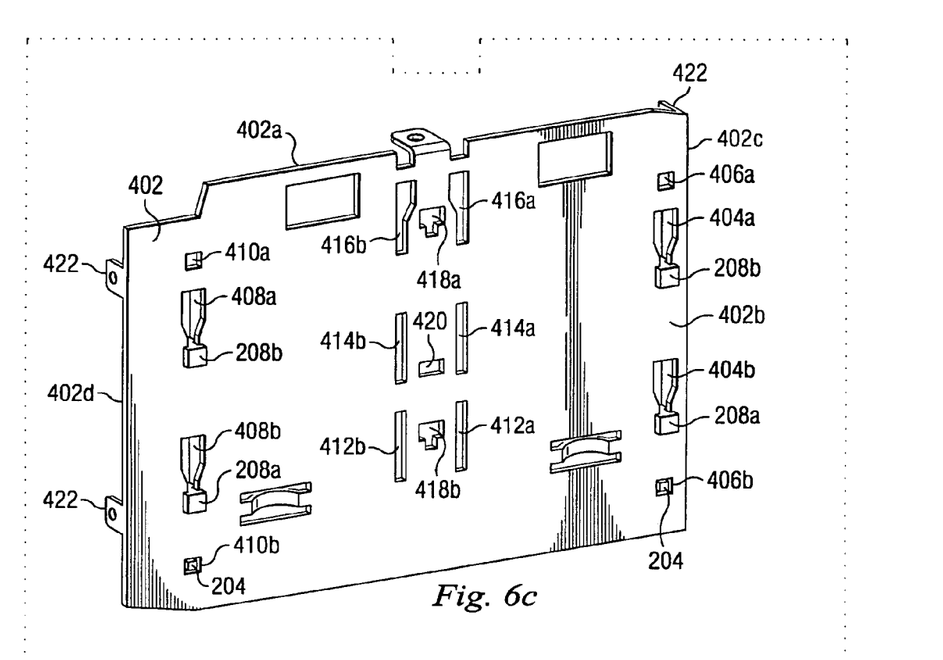
FIG. 6c is a rear perspective view illustrating an embodiment of the plurality of guide members and the wall of FIG. 6b.
Figure 6D:
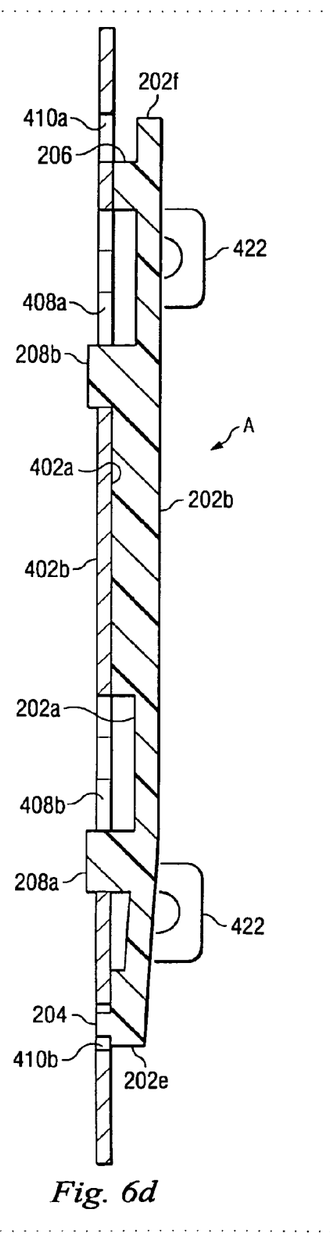
FIG. 6d is a cross sectional view illustrating an embodiment of the plurality of guide members and the wall of FIG. 6b.

Referring now to FIGS. 2, 4a, 4b, 6a, 6b, 6c, and 6d, a method 600 for coupling a component to a chassis is illustrated. The method 600 begins at step 602 where the wall 400, described above with reference to FIGS. 4a and 4b, is provided. The method 600 then proceeds to step 604 where a plurality of the guide members 200 are coupled to the wall 400. The guide member 200 is positioned adjacent the wall 400 such that the front surface 202a of the guide member 200 is adjacent the front surface 402a of the wall 400 and the coupling members 208a and 208b are adjacent the guide coupling apertures 408b and 408a, respectively. The coupling members 208a and 208b are then extended through the guide coupling apertures 408b and 408a, respectively, and secured in the guide coupling apertures 408b and 408a, respectively. The tapering of the guide coupling apertures 408b and 408a allows the coupling members 208a and 208b, respectively, to be secured in the guide coupling apertures 408b and 408a, respectively, by moving the guide member 200 such that the coupling members 208a and 208b, respectively, enter the narrowed portion of the guide coupling apertures 408b and 408a, respectively, as illustrated in FIG. 6c. The guide member 200 is coupled to the wall 400 in a first orientation A when the securing tab 204 enters the securing aperture 410b. A guide member 200 may be coupled to the wall 400 through the guide coupling apertures 404a and 404b and the securing aperture 406b in substantially the same manner as described above for the guide coupling apertures 408a and 408b and securing aperture 410b, as illustrated in FIG. 6c.

Figure 6E:
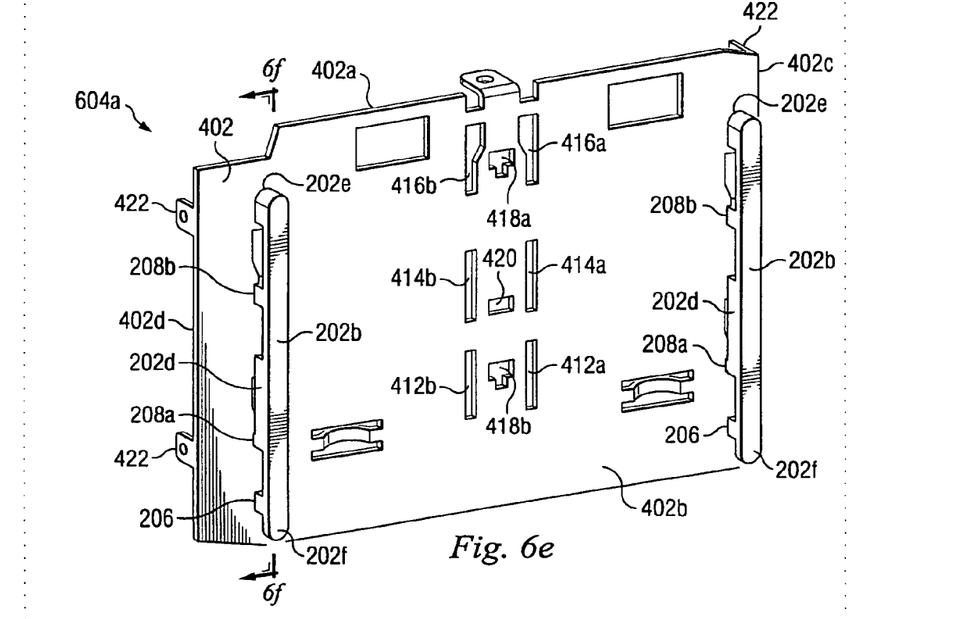
FIG. 6e is a rear perspective view illustrating an embodiment of a plurality of the guide members of FIG. 2 coupled to the wall of FIG. 6b.
Figure 6F:
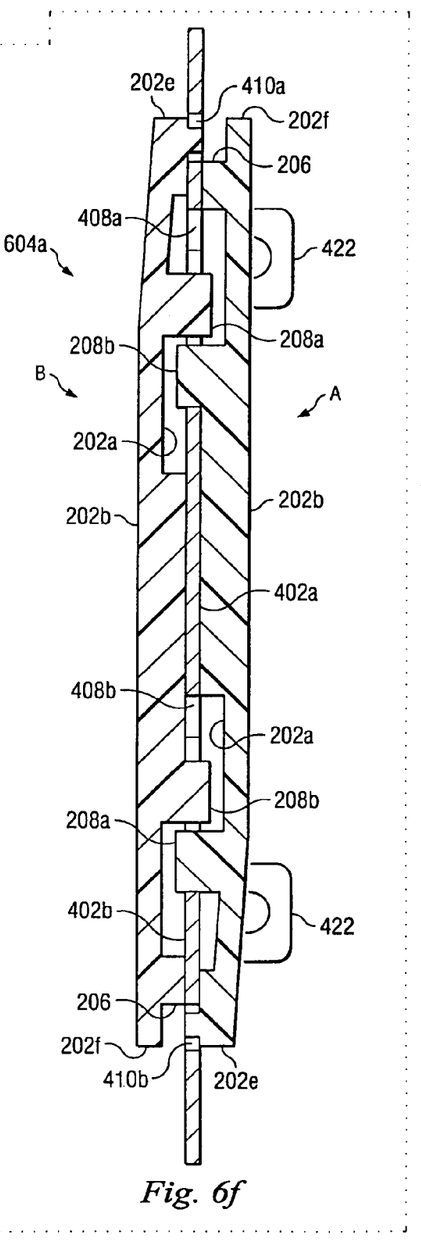
FIG. 6f is a cross sectional view illustrating an embodiment of the plurality of guide members and the wall of FIG. 6e.
Figure 6G:
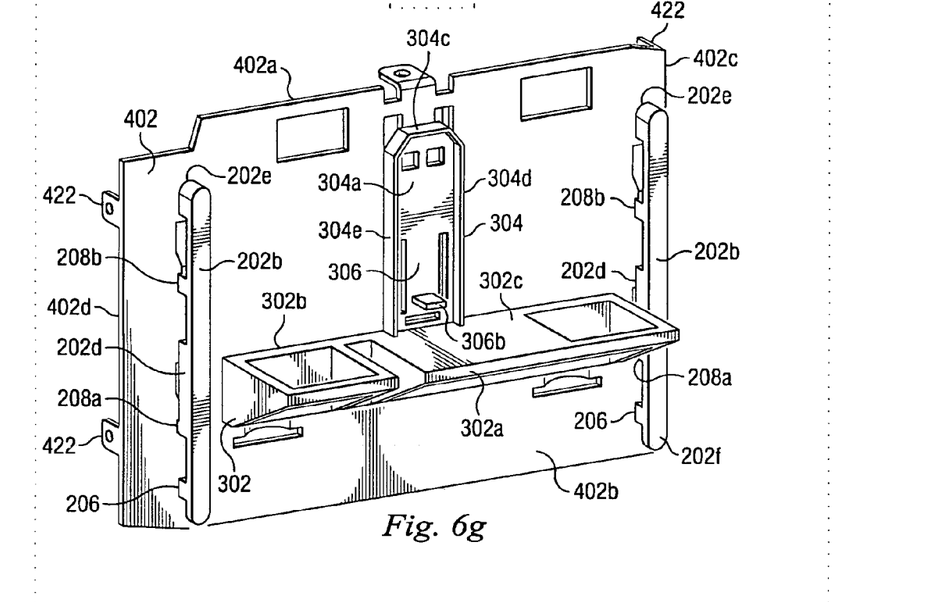
FIG. 6g is a rear perspective view illustrating an embodiment of the guide feature of FIGS. 3a and 3b coupled to the plurality of guide members and the wall of FIG. 6e.

Referring now to FIGS. 2, 4a, 4b, 6a, 6b, 6c, 6d, 6e, and 6f, the method 600 continues with step 604 by coupling a guide member 200 to the wall 400. The guide member 200 is positioned adjacent the wall 400 such that the front surface 202a of the guide member 200 is adjacent the rear surface 402b of the wall 400 and the coupling members 208a and 208b are adjacent the guide coupling apertures 408a and 408b, respectively. The coupling members 208a and 208b are then extended through the guide coupling apertures 408a and 408b, respectively, and secured in the guide coupling apertures 408a and 408b, respectively. The tapering of the guide coupling apertures 408a and 408b allows the coupling members 208a and 208b, respectively, to be secured in the guide coupling apertures 408a and 408b, respectively, by moving the guide member 200 such that the coupling members 208a and 208b, respectively, enter the narrowed portion of the guide coupling apertures 408a and 408b, respectively, and are positioned immediately adjacent the coupling members 208b and 208a, respectively, on the guide member 200 which is coupled to the front surface 402a of the wall 400, as illustrated in FIG. 6f. The guide member 200 is coupled to the wall 400 in a second orientation B when the securing tab 204 enters the securing aperture 410a, the second orientation B being rotated 180 degrees from the first orientation A such that the top end 202e on the guide member 200 coupled to the rear surface 402b of the wall 400 is adjacent the bottom end 202f of the guide member 200 coupled to the front surface 402a of the wall 400, as illustrated in FIG. 6f. A guide member 200 may be coupled to the wall 400 through the guide coupling apertures 404a and 404b and the securing aperture 406a in substantially the same manner as described above for the guide coupling apertures 408a and 408b and securing aperture 410a, as illustrated in FIG. 6e. With the guide members 200 coupled to the front surface 402a and the rear surface 402b of the wall 400, a component coupling apparatus 604a is provided which includes the wall 400 and the guide members 200 coupled to either side of the wall 400 through the coupling apertures 408a and 408b and nested within each other, resulting in a component coupling apparatus 604a occupying a relatively small amount of space as compared to a conventional component coupling apparatus.

Figure 6H:
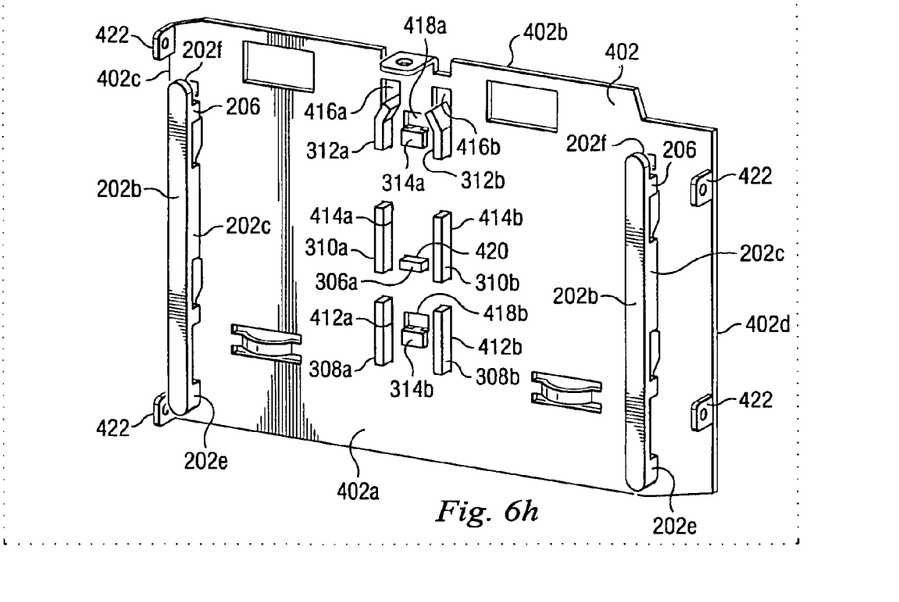
FIG. 6h is a front perspective view illustrating an embodiment of the guide feature, the plurality of guide members, and the wall of FIG. 6g.

Referring now to FIGS. 3a, 3b, 4a, 4b, 6a, 6g, and 6h, the method 600 continues with step 604 by coupling the guide feature 300 to the wall 400. The guide feature 400 is positioned adjacent the wall 400 such that the rear surface 302b of the base 302 and the rear surface 304b of the mounting arm 304 are adjacent the rear surface 402b of the wall 400. The guide feature 300 may then be coupled to the wall 400 by positioning the guide surfaces 308a and 308b in the guide feature apertures 412a and 412b, respectively, positioning the guide surfaces 310a and 310b in the guide feature apertures 414a and 414b, respectively, and positioning the guide surfaces 312a and 312b in the guide feature apertures 416a and 416b, respectively, such that the coupling members 314a and 314b enter the coupling apertures 418a and 418b, respectively. The tapering of the guide coupling apertures 418a and 418b allows the coupling members 314a and 314b, respectively, to be secured in the guide coupling apertures 418a and 418b, respectively, by moving the guide feature 300 such that the coupling members 314a and 314b, respectively, enter the narrowed portion of the guide coupling apertures 418a and 418b, respectively, as illustrated in FIG. 6h. The guide feature 300 is coupled to the wall 400 when the securing tab 306a is positioned in the securing aperture 420. With the guide feature 300 coupled to the wall 400, the guide surfaces 308a, 308b, 310a, 310b, 312a, and 312b extend out past the front surface 402a of the wall 400. In an embodiment, the guide feature 300 may be removed from the wall 400 by using the beam handle 306b to deflect the wall securing beam 306 and remove the securing tab 306 from the securing aperture 400.

Figure 6I:
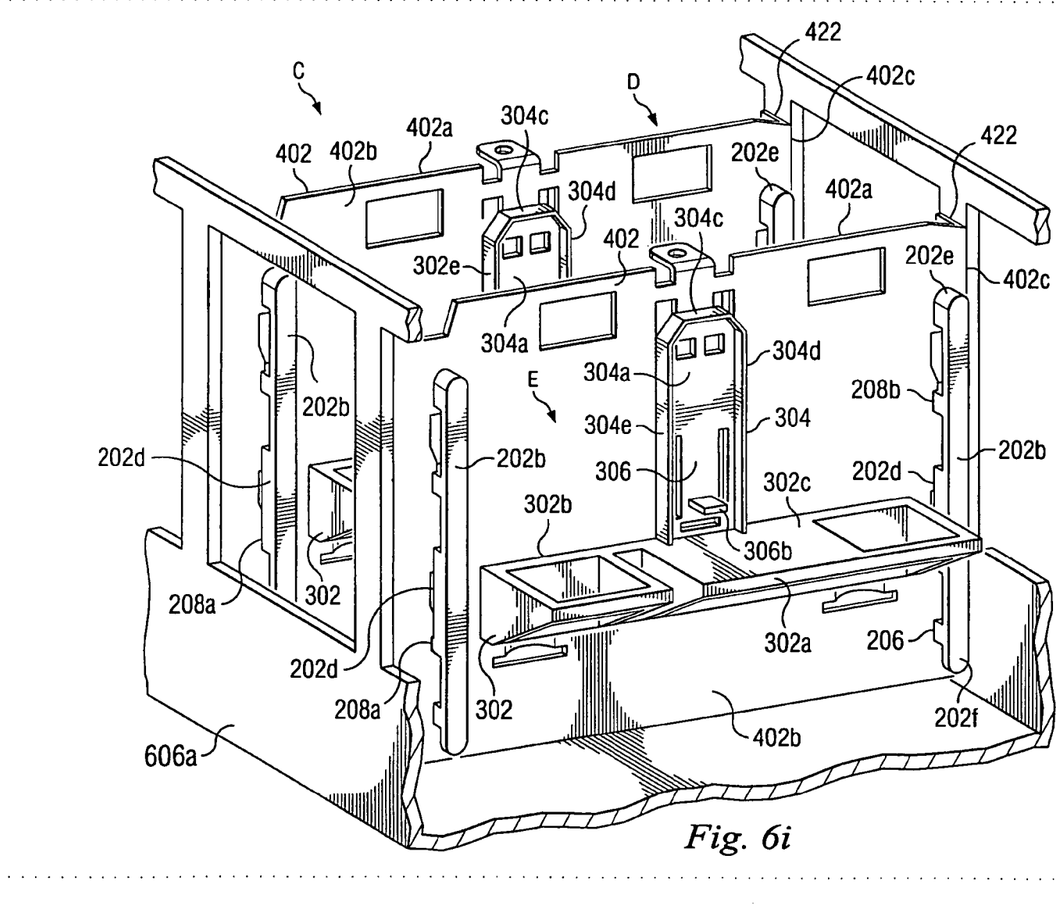
FIG. 6i is a perspective view illustrating an embodiment of a chassis with the guide feature, the plurality of guide members, and the wall of FIG. 6g coupled to it.

Referring now to FIGS. 5, 6a, 6g, 6h, and 6i, the method 600 proceeds to step 606 where the wall 400 is coupled to the a chassis. A chassis 606a is provided and the wall 400 is positioned in and coupled to the chassis 606a by, for example, securing the chassis mounting tabs 422 to the chassis 606a. Another wall 400 is then positioned substantially parallel to and spaced part from the first wall 400 and coupled to the chassis 606a by, for example, securing the chassis mounting tabs 422 to the chassis 606a, as illustrated in FIG. 6i. In an embodiment, additional walls 400 may be coupled to the chassis 606a. The coupling of the walls 400 to the chassis 606a defines a component slot C between the guide member 200 coupled to the rear surface 402b of the wall 400, the guide surface 304e on the guide feature 300 coupled to the rear surface 402b of the wall 400, the guide member 200 coupled to the front surface 402a of the wall 400, and the guide surfaces 308b, 310b, and 312b on the guide feature 300 coupled to the front surface 402a of the wall 400. The coupling of the walls 400 to the chassis 606a defines a component slot D between the guide member 200 coupled to the rear surface 402b of the wall 400, the guide surface 304d on the guide feature 300 coupled to the rear surface 402b of the wall 400, the guide member 200 coupled to the front surface 402a of the wall 400, and the guide surfaces 308a, 310a, and 312a on the guide feature 300 coupled to the front surface 402a of the wall 400. The coupling of the walls 400 to the chassis 606a defines a component slot E between the guide member 200 coupled to the rear surface 402b of the wall 400, the guide surface 304e on the guide feature 300 coupled to the rear surface 402b of the wall 400, and various guide features (not shown) similar to those described above.

Figure 6J:
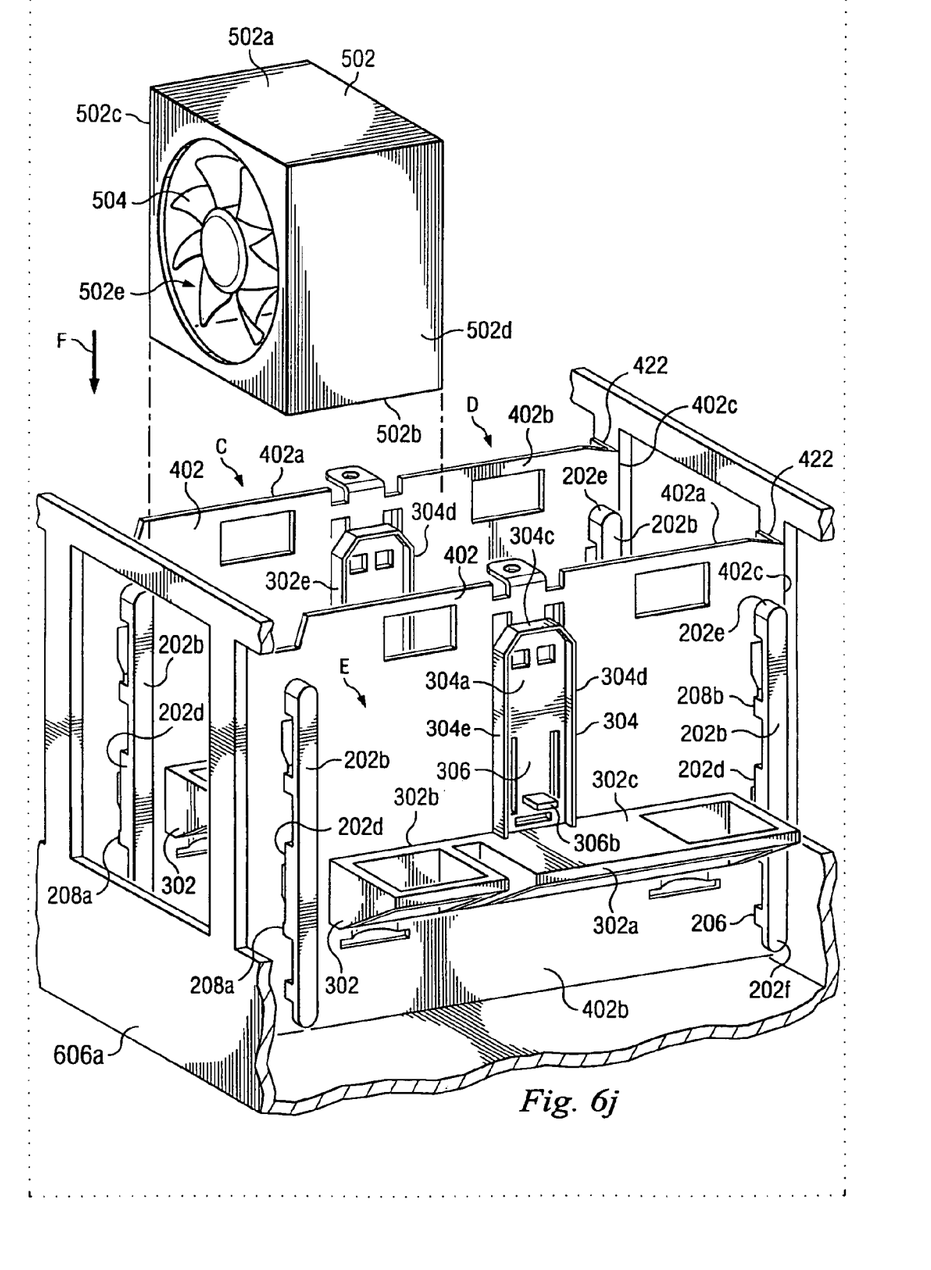
FIG. 6j is a front perspective view illustrating an embodiment of a component being coupled to the guide feature, the plurality of guide members, the wall, and the chassis of FIG. 6i.
Figure 6K:
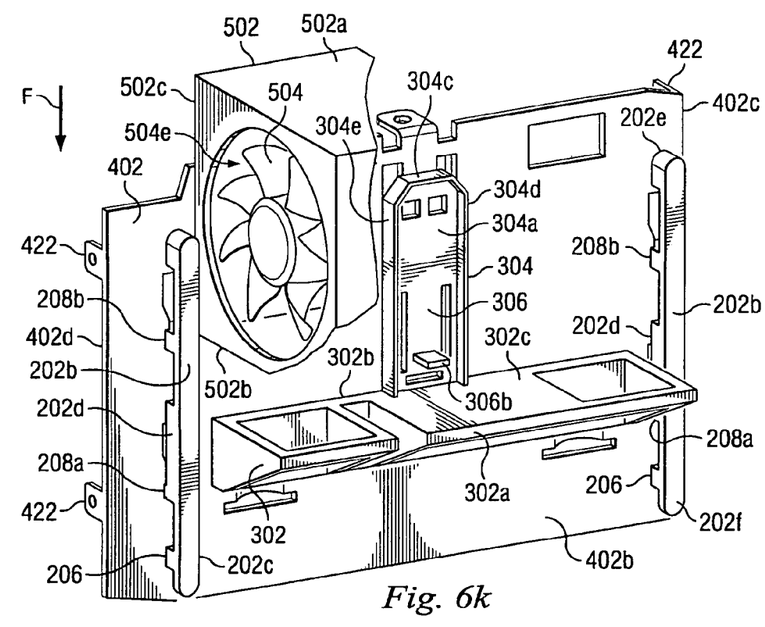
FIG. 6k is a cut away perspective view illustrating an embodiment of a component being coupled to the guide feature, the plurality of guide members, the wall, and the chassis of FIG. 6i.
Figure 6L:
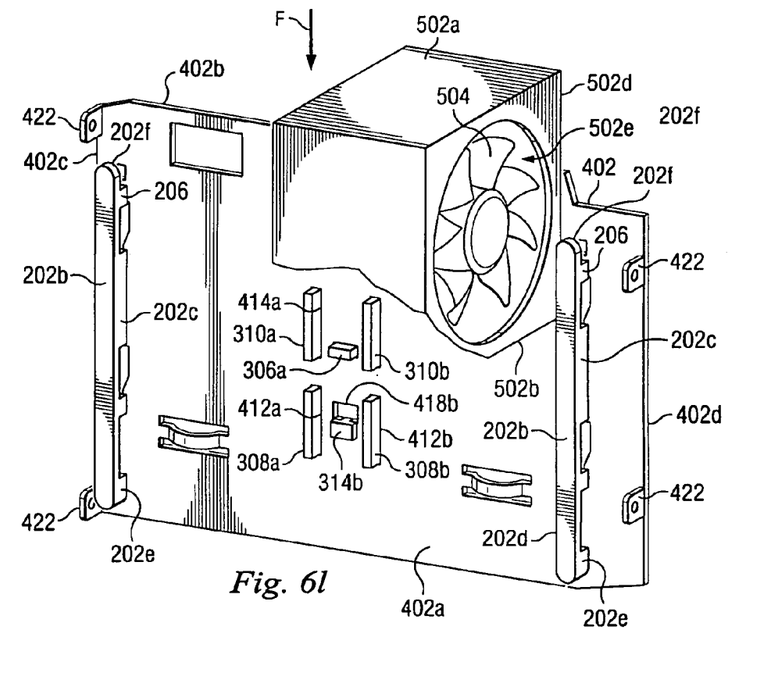
FIG. 6l is a cut away perspective view illustrating an embodiment of a component being coupled to the guide feature, the plurality of guide members, the wall, and the chassis of FIG. 6i.
Figure 6M:
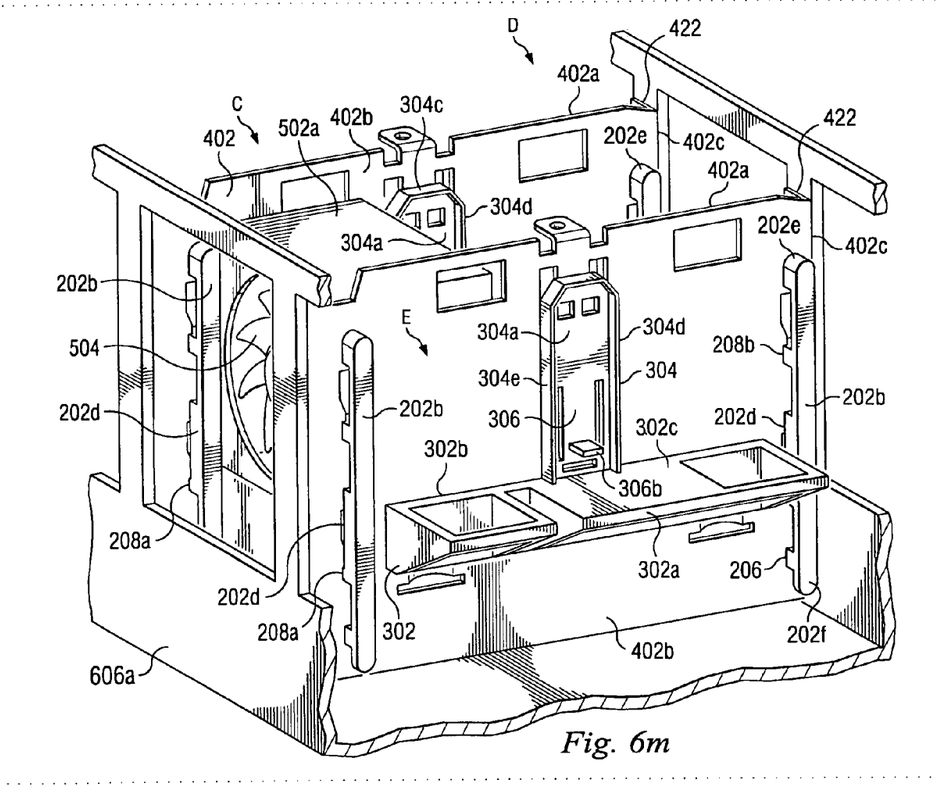
FIG. 6m is a perspective view illustrating an embodiment of a component coupled to the guide feature, the plurality of guide members, the wall, and the chassis of FIG. 6i.
Figure 6N:
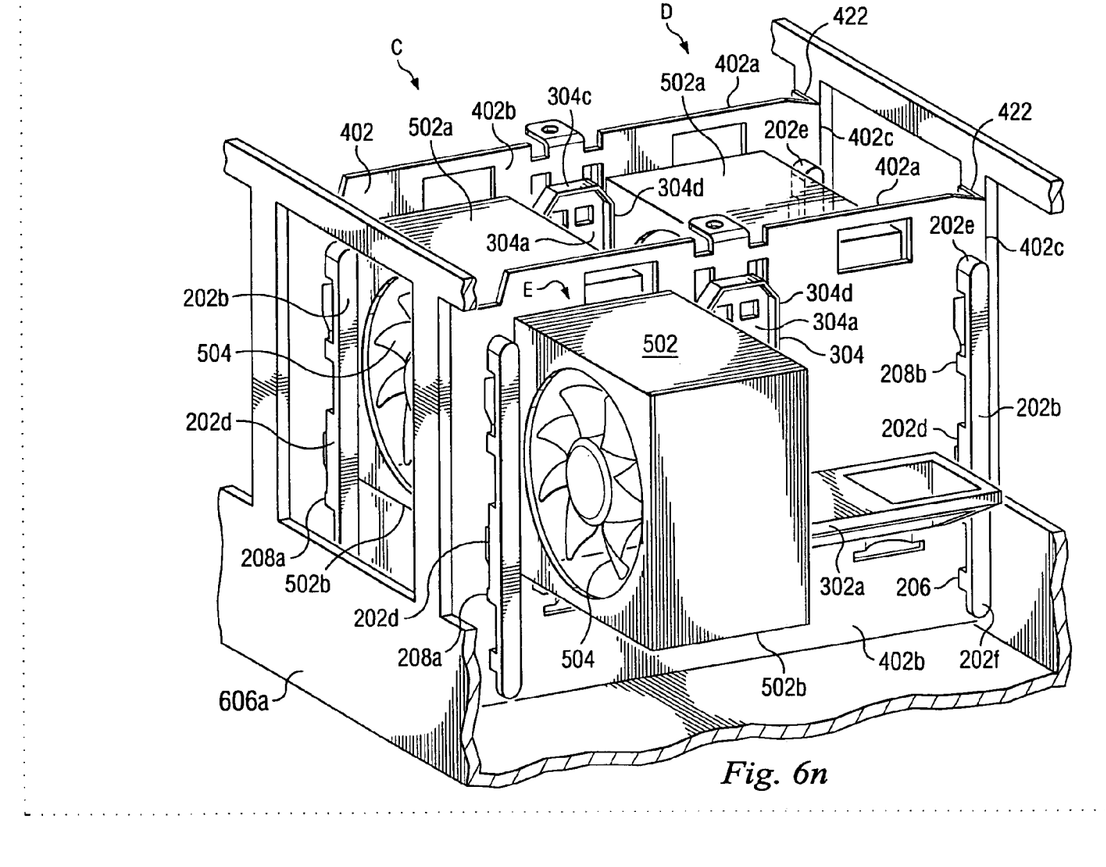
FIG. 6n is a perspective view illustrating an embodiment of a plurality of components coupled to the guide feature, the plurality of guide members, the wall, and the chassis of FIG. 6i.

Referring now to FIGS. 5, 6a, 6g, 6h, 6i, 6j, 6k, 6l, 6m, and 6n, the method 600 proceeds to step 608 where a first component is coupled to the chassis 606a. A component such as, for example, the fan module 500 described above with reference to FIG. 5, is positioned above the chassis 606a such that the bottom surface 502b of the fan module 500 is adjacent the component slot C defined between the walls 400, as illustrated in FIG. 6j. The fan module 500 is then moved in a direction F such that the fan module 500 enters the component slot C with the side surface 502c positioned between the guide surface 202c on guide member 200 and the guide surface 304e on guide feature 300, as illustrated in FIG. 6k, and the side surface 502d positioned between the guide surface 202d on guide member 200 and the guide surfaces 308b, 310b, and 312b on guide feature 300, as illustrated in FIG. 6l. Continued movement of the fan module 500 in direction F results in the coupling of the fan module 500 to the chassis 606a in component slot C, as illustrated in FIG. 6m. A plurality of additional components such as, for example, the fan modules 500, may be coupled to the chassis 606a and positioned in the components slots D and E in the same manner as the fan module 500 was positioned to in the component slot C, as illustrated in FIG. 6n. Thus, a method and apparatus are provided which allow the coupling of components to a chassis while taking up relatively less space in the chassis as compared to a conventional component coupling apparatus.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component coupling apparatus, comprising:
   a wall comprising a first surface, a second surface located opposite the first surface, and defining a guide coupling aperture extending through the wall from the first surface to the second surface;
   a first guide member coupled to the wall through the guide coupling aperture and positioned adjacent the first surface; and
   a second guide member coupled to the wall through the guide coupling aperture and positioned adjacent the second surface.

2. The apparatus of claim 1, wherein the wall comprises a guide feature extending from the first surface in a spaced apart relationship from the first guide member.

3. The apparatus of claim 1, wherein the wall comprises a guide feature extending from the second surface in a spaced apart relationship from the second guide member.

4. The apparatus of claim 1, wherein the wall defines a plurality of guide coupling apertures, whereby the first guide member is coupled to the wall through the plurality of guide coupling apertures and positioned adjacent the first surface and the second guide member is coupled to the wall through the plurality of guide coupling apertures and positioned adjacent the second surface.

5. The apparatus of claim 1, wherein the first guide member and the second guide member comprise substantially identical dimensions, whereby the first guide member is coupled to the wall through the guide coupling aperture in a first orientation and the second guide member is coupled to the wall through the guide coupling aperture in a second orientation.

6. The apparatus of claim 1, further comprising:
   a chassis, whereby the wall is mounted in the chassis.

7. The apparatus of claim 5, wherein the second orientation is rotated approximately 180 degrees from the first orientation.

8. The apparatus of claim 6, further comprising:
   a first component coupled to the chassis, whereby the first component engages the first guide member.

9. The apparatus of claim 8, further comprising:
   a second component coupled to the chassis, whereby the second component engages the second guide member.

10. An information handling system, comprising:
    a chassis;
    a microprocessor coupled to the chassis;
    a wall mounted in the chassis and comprising a first surface, a second surface located opposite the first surface, and defining a guide coupling aperture extending through the wall from the first surface to the second surface;
    a first guide member coupled to the wall through the guide coupling aperture and positioned adjacent the first surface; and
    a second guide member coupled to the wall through the guide coupling aperture and positioned adjacent the second surface.

11. The system of claim 10, wherein the wall comprises a guide feature extending from the first surface in a spaced apart relationship from the first guide member.

12. The system of claim 10, wherein the wall comprises a guide feature extending from the second surface in a spaced apart relationship from the second guide member.

13. The system of claim 10, wherein the wall defines a plurality of guide coupling apertures, whereby the first guide member is coupled to the wall through the plurality of guide coupling apertures and positioned adjacent the first surface and the second guide member is coupled to the wall through the plurality of guide coupling apertures and positioned adjacent the second surface.

14. The system of claim 10, wherein the first guide member and the second guide member comprise substantially identical dimensions, whereby the first guide member is coupled to the wall through the guide coupling aperture in a first orientation and the second guide member is coupled to the wall through the guide coupling aperture in a second orientation.

15. The system of claim 10, further comprising:
    a first component coupled to the chassis, whereby the first component engages the first guide member.

16. The system of claim 10, further comprising:
    a second component coupled to the chassis, whereby the second component engages the second guide member.

17. The system of claim 14, wherein the second orientation is rotated approximately 180 degrees from the first orientation.

18. The system of claim 15, wherein the first component is a fan module.

19. A method for coupling a component to a chassis, comprising:
    providing a chassis comprising a wall having a first surface, a second surface located opposite the first surface, and defining a guide coupling aperture extending through the wall from the first surface to the second surface;

coupling a first guide member to the wall adjacent the first surface through the guide coupling aperture; and coupling a second guide member to the wall adjacent the second surface through the guide coupling aperture.

20. The method of claim 19, further comprising:

coupling a first component to the chassis by engaging the first guide member.

21. The method of claim 20, further comprising:

coupling a second component to the chassis by engaging the second guide member.

22. A component coupling apparatus, comprising:

a wall comprising a first surface, a second surface located opposite the first surface, and defining a guide coupling aperture extending through the wall from the first surface to the second surface;

a first guide member coupled to the wall through the guide coupling aperture and positioned adjacent the first surface in a first orientation; and a second guide member coupled to the wall through the guide coupling aperture and positioned adjacent the second surface in a second orientation, whereby the second orientation is rotated approximately 180 degrees from the first orientation and the second guide member is nested within the first guide member, providing a guide member on each side of a single wall.

* * * * *